(12) United States Patent
Short, Jr. et al.

(10) Patent No.: US 9,750,160 B2
(45) Date of Patent: Aug. 29, 2017

(54) MULTI-LEVEL OSCILLATING HEAT PIPE IMPLEMENTATION IN AN ELECTRONIC CIRCUIT CARD MODULE

(71) Applicant: Raytheon Company, Waltham, MA (US)

(72) Inventors: Byron Elliott Short, Jr., Fairview, TX (US); Nathan R. Francis, Dallas, TX (US); David B. Brandt, Garland, TX (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 15/002,256

(22) Filed: Jan. 20, 2016

(65) Prior Publication Data

US 2017/0208706 A1    Jul. 20, 2017

(51) Int. Cl.
*H05K 7/20* (2006.01)
*F28D 15/02* (2006.01)
*B23P 15/26* (2006.01)

(52) U.S. Cl.
CPC .......... *H05K 7/20336* (2013.01); *B23P 15/26* (2013.01); *F28D 15/0275* (2013.01); *H05K 7/2039* (2013.01); *H05K 7/20309* (2013.01); *H05K 7/20318* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548;
(Continued)

(56) References Cited

U.S. PATENT DOCUMENTS 6,019,165 A * 2/2000 Batchelder .............. F25B 21/02
                                              165/104.33
6,253,829 B1 * 7/2001 Mashiko ................ B22D 17/24
                                              164/109
(Continued)

OTHER PUBLICATIONS

Boswell, et al.; "Circuit Card Assembly Heat Sinks Embedded With Oscillating Heat Pipes"; Electronics Cooling; Mar. 2015.
(Continued)

*Primary Examiner* — Anthony Haughton
*Assistant Examiner* — Razmeen Gafur

(57) ABSTRACT

One or both of a module cover and a heat sink for a circuit card module includes a multi-level cooling structure formed by a body, sidewalls extending from edges of the body and, together with the body, partially enclosing a volume, flanges projecting from ends of the sidewalls opposite the body and away from the volume, and an oscillating heat pipe within the body, the sidewalls, and the flanges. The oscillating heat pipe fluid path repeatedly traverses the body, a length of each of the sidewalls, and a portion of each of the flanges. The oscillating heat pipe provides cooling through both phase change of fluid slugs and vapor bubbles within the oscillating heat pipe and movement of the fluid slugs and the vapor bubbles along the fluid path between an evaporator adjacent a first of the flanges and a condenser adjacent a second of the flanges.

20 Claims, 5 Drawing Sheets

(58) Field of Classification Search
USPC ... 257/712–722, E23.088; 24/453, 458–459; 454/184; 312/236
See application file for complete search history.

(56) References Cited

U.S. PATENT DOCUMENTS

| | | | |
|---|---|---|---|
| 6,269,865 B1* | 8/2001 | Huang | F28D 15/0266 165/104.26 |
| 6,631,077 B2* | 10/2003 | Zuo | F28F 13/10 165/104.33 |
| 6,672,373 B2 | 1/2004 | Smyrnov | |
| 6,679,316 B1* | 1/2004 | Lin | F28D 15/0233 165/104.26 |
| 6,741,464 B2 | 5/2004 | Kitano et al. | |
| 6,789,611 B1* | 9/2004 | Li | F28D 15/0266 165/104.22 |
| 6,867,973 B2 | 3/2005 | Chang | |
| 7,345,877 B2 | 3/2008 | Asfia et al. | |
| 7,547,124 B2 | 6/2009 | Chang et al. | |
| 8,547,703 B2* | 10/2013 | Aoki | H01L 23/4093 174/252 |
| 8,659,042 B2 | 2/2014 | Paschkewitz et al. | |
| 8,919,426 B2 | 12/2014 | Hardesty | |
| 2001/0023757 A1* | 9/2001 | Huang | F28D 15/0266 165/104.26 |
| 2002/0108743 A1* | 8/2002 | Wirtz | F28F 13/003 165/185 |
| 2002/0182332 A1* | 12/2002 | Qu | C09K 5/00 427/419.1 |
| 2003/0066638 A1* | 4/2003 | Qu | C09K 5/14 165/186 |
| 2003/0192674 A1* | 10/2003 | Ippoushi | F28D 15/0233 165/104.21 |
| 2005/0212124 A1* | 9/2005 | Wang | H01L 23/473 257/714 |
| 2007/0025078 A1* | 2/2007 | Silverstein | F28D 15/0266 361/688 |
| 2007/0119575 A1* | 5/2007 | Glezer | H01L 23/427 165/104.33 |
| 2008/0030956 A1* | 2/2008 | Silverstein | F28D 15/0266 361/700 |
| 2008/0099189 A1* | 5/2008 | Suh | F28D 15/0266 165/104.21 |
| 2010/0212331 A1* | 8/2010 | Critser | A01N 1/02 62/51.1 |
| 2010/0319884 A1* | 12/2010 | Okuyama | F28D 15/04 165/104.26 |
| 2013/0049497 A1* | 2/2013 | Terakado | H02K 7/006 310/54 |
| 2013/0133871 A1* | 5/2013 | Ma | F28D 15/0266 165/185 |
| 2013/0186601 A1* | 7/2013 | Monson | H05K 7/20672 165/104.26 |
| 2013/0206367 A1* | 8/2013 | Chen | F28F 3/02 165/104.19 |
| 2014/0165570 A1* | 6/2014 | Herring | F02C 7/14 60/730 |
| 2014/0190666 A1* | 7/2014 | Schlie | F28D 15/0266 165/104.21 |
| 2014/0202665 A1 | 7/2014 | Paschkewitz | |
| 2014/0362530 A1* | 12/2014 | Figus | F28D 15/043 361/698 |
| 2014/0369377 A1* | 12/2014 | Sakami | G01N 25/64 374/28 |
| 2015/0060023 A1* | 3/2015 | Herring | F28D 15/0208 165/104.26 |
| 2015/0181763 A1* | 6/2015 | de Bock | B23P 15/26 361/689 |
| 2015/0323261 A1* | 11/2015 | Tseng | F28D 15/0233 165/104.22 |

OTHER PUBLICATIONS

Khandekar, "An Introduction to Pulsating Heat Pipes", Electronics Cooling Magazine, May 2003, 6 pgs.
Wiese-Fales, Jan, "Oscillating Heat Pipes Offer an Elegant Thermal Management Solution", Mizzou Engineer, Winter 2013, 5 pgs.

* cited by examiner

MULTI-LEVEL OSCILLATING HEAT PIPE IMPLEMENTATION IN AN ELECTRONIC CIRCUIT CARD MODULE

TECHNICAL FIELD

The present disclosure is directed in general to oscillating heat pipes and, more particularly, to oscillating heat pipes within cooling structures associated with a three-dimensional volume.

BACKGROUND OF THE DISCLOSURE

Oscillating heat pipe structures associated with printed wiring board assemblies are typically "planar" structures formed entirely within a thin, rectangular box, limiting their usefulness as cooling systems for covers receiving the device(s) to be cooled and secured to a coldwall by flanges offset from the body.

SUMMARY OF THE DISCLOSURE

At least one of a module cover and a heat sink on opposite sides of and housing a circuit card assembly within a circuit card module includes a multi-level cooling structure. The multi-level cooling structure includes a body, sidewalls extending at a 90° angle to the body from edges of the body and, together with the body, partially enclosing a volume, flanges projecting at a 90° angle to the sidewalls from ends of the sidewalls opposite the body and away from the volume, and an oscillating heat pipe within the body, the sidewalls, and the flanges. A fluid path for the oscillating heat pipe repeatedly traverses the body, a length of each of the sidewalls, and a portion of each of the flanges. The oscillating heat pipe provides cooling through both phase change of fluid slugs and vapor bubbles within the oscillating heat pipe and movement of the fluid slugs and the vapor bubbles along the fluid path between an evaporator adjacent a first of the flanges and a condenser adjacent a second of the flanges. The oscillating heat pipe fluid path traverses the body and a first of the sidewalls and extends into the first flange, turns in a U shape within the first flange back to the first sidewall, traverses the first sidewall, the body, and a second of the sidewalls and extends into the second flange, turns in a U shape within the second flange back to the second sidewall, and traverses the second sidewall, the body, and the first sidewall. The oscillating heat pipe fluid path turns 90° from the body into each of the sidewalls and from one of the sidewalls into one of the flanges. A portion of the oscillating heat pipe fluid path within at least one of the flanges is offset from a portion of the oscillating heat pipe fluid path within the body. Segments of the oscillating heat pipe within the body are horizontal, segments of the oscillating heat pipe within the sidewalls are vertical, and segments of the oscillating heat pipe within the flanges are horizontal. The oscillating heat pipe fluid path traverses the body in parallel tracks along a length of the body. The circuit card assembly is at least partially received within the volume, with one or more components on the circuit card assembly contacting the body of the multi-level cooling structure.

Within a multi-level structure formed by a body, sidewalls extending from edges of the body and, together with the body, partially enclosing a volume, and flanges projecting from ends of the sidewalls opposite the body and away from the volume, a cooling method includes providing an oscillating heat pipe within the body, the sidewalls, and the flanges, with a fluid path for the oscillating heat pipe repeatedly traversing the body, a length of each of the sidewalls, and a portion of each of the flanges. The method also includes providing an evaporator adjacent a first of the flanges and a condenser adjacent a second of the flanges, where the oscillating heat pipe provides cooling through both phase change of fluid slugs and vapor bubbles within the oscillating heat pipe and movement of the fluid slugs and the vapor bubbles along the fluid path between the evaporator and the condenser.

A circuit card module includes a module cover having a body and sidewalls partially enclosing a first volume, and flanges, as well as a heat sink including a body and sidewalls partially enclosing a second volume adjacent the first volume, and flanges. The circuit card module houses a circuit card assembly within the first and second volumes with at least one component on the circuit card assembly in contact with one of the module cover body and the heat sink body. An evaporator is disposed adjacent a first of the module cover flanges and a first of the heat sink flanges and a condenser is disposed adjacent a second of the module cover flanges and a second of the heat sink flanges. A first oscillating heat pipe within the module cover body, the module cover sidewalls, and the module cover flanges, has a first fluid path that repeatedly traverses the module cover body, a length of each of the module cover sidewalls, and a portion of each of the module cover flanges. A second oscillating heat pipe within the heat sink body, the heat sink sidewalls, and the heat sink flanges, has a second fluid path that repeatedly traverses the heat sink body, a length of each of the heat sink sidewalls, and a portion of each of the heat sink flanges. The first and second oscillating heat pipes each provide cooling through both phase change of fluid slugs and vapor bubbles within the respective oscillating heat pipes and movement of the fluid slugs and the vapor bubbles along the first and second fluid paths between the evaporator and the condenser.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
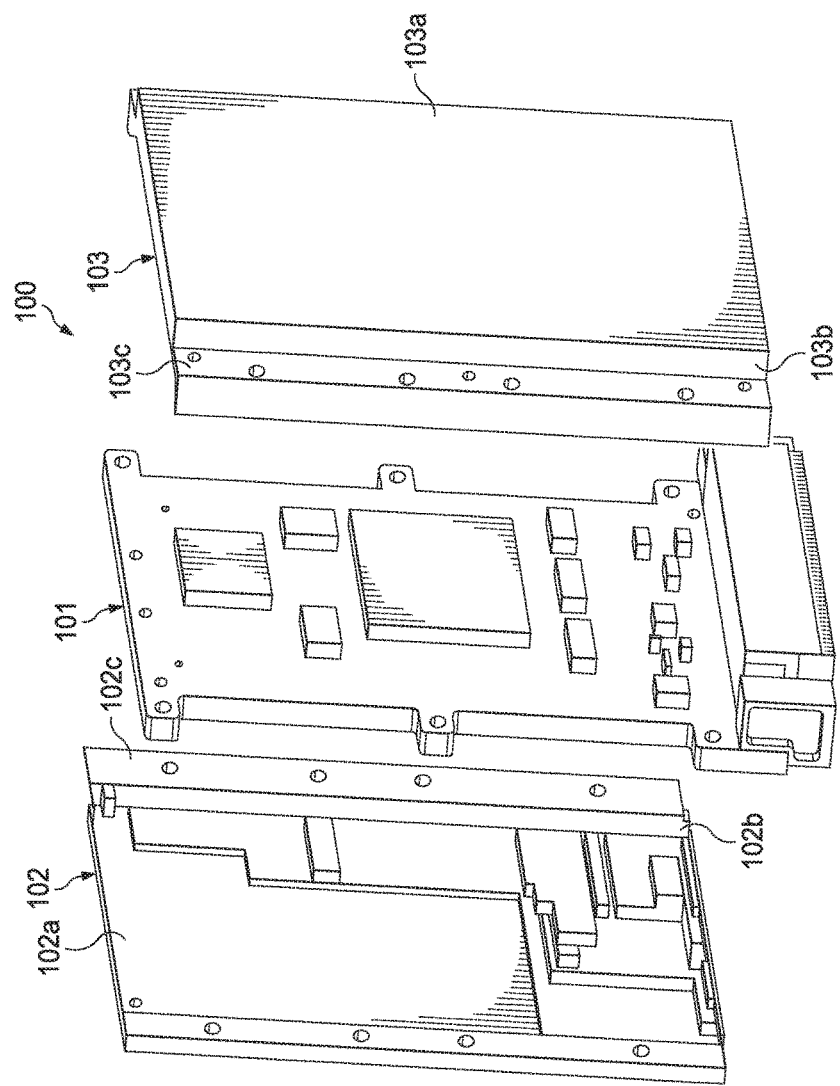
FIGS. 1A and 1B are different perspective views of an electronics card module implementing multi-level oscillating heat pipes in accordance with embodiments of the present disclosure.

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below. Additionally, unless otherwise specifically noted, articles depicted in the drawings are not necessarily drawn to scale.

High power circuit card assemblies increasingly require better thermal dissipation to reduce temperature increases resulting from operation of components mounted in the assembly. Current electronic card modules typically create parallel heat conduction paths to spread and ultimately dissipate heat using heatsinks and thermal diffusion covers formed from one or more of: high thermal conductivity metal, such as aluminum, copper, beryllium oxide, or combinations thereof; annealed pyrolytic graphite (APG) embedded in metal; embedded wick-action heat pipes within metal; or oscillating heat pipes in metal. Metals with a thermal conductivity constant k greater than that of aluminum typically give rise to weight, cost, and/or fabrication issues. Annealed pyrolytic graphite is expensive and has directional thermal conductivity, with a thermal conductivity constant $k_z$ that is much lower in one direction (z) than the thermal conductivity constant $k_{xy}$ in the plane of the remaining two directions (x and y). Wick-action heat pipes often require a minimum diameter that, even with flattening, can exceed the maximum desired plate thickness.

Oscillating heat pipes utilize both phase change and fluid motion to enhance the heat transfer within a structure, such as the heatsink core or the covers of a multi-board circuit card electronics module. Phase change from liquid to vapor and back coupled with vapor bubble/liquid slug oscillation through the wickless flow channels between a condenser and evaporator facilitate thermal transfer and cooling. However, most oscillating heat pipe designs consist of a basically planar structure of flow channels embedded in the metal heatsink core or the module covers. The oscillating heat pipe flow channel sections are contained within a thin rectangular box region. Although the flow channels have a diameter (or cross-sectional area), the central path of the flow channels lies substantially within a two-dimensional planar area.

As a result of the generally planar nature of oscillating heat pipe flow channels, use of these structures in electronic circuit card modules often rely on the base metal thermal conduction path to the clamped edge. The conduction heat transfer path from the oscillating heat pipe fluid path to the module edge that is clamped is through metal, and is therefore limited to the thermal conductivity of the metal. In an electronic circuit card module cover with sidewalls and rail contact flanges, the thermal resistance from the clamped edge to the two-dimensional planar oscillating heat pipe structure depends on the specific metal used for the cover and the thickness of that metal in the sidewalls and rail contact flanges. Because oscillating heat pipes provide a significant increase of lateral heat spreading versus metal alone, the edge thermal resistance of the base metal (in series with the planar oscillating heat pipe spreader) can be on the order of the planar oscillating heat pipe spreader thermal resistance. It would be preferable for the lower thermal resistance of oscillating heat pipes to extend all the way through the sidewalls and to and into the clamped edges (rail contact flanges) of the electronic circuit card module cover.

Wrapping the flow channels through the bend of heatsink or cover edges to create a fluid path (where "fluid path" encompasses a path for liquid, vapor, or a combination of both) directly into the surface in contact with the coldwall will significantly reduce the thermal resistance from the planar portion of the heatsink core or covers to the module edges. The heat transfer path becomes three-dimensional rather than two-dimensional (or planar). In addition, extending the fluid channels into the surfaces in contact with the coldwall places the condenser portion of the oscillating heat pipe in direct contact with the coldwall. The present disclosure therefore extends the path for the oscillating fluid/vapor bubbles directly into the module edge clamped to the coldwall. The oscillating heat pipe within the core or covers, which enhances removal of heat from electronic components, turns the corners from the planar section of the module through the side walls to the clamped edge surfaces of the rail contact flanges. The fluid/vapor channels are extended into the clamped portion of the core or cover, so that the condenser portion is in direct contact with the coldwall. The thermal resistance from the coldwall to the condenser of the oscillating heat pipe is significantly reduced.

Figure 1B:
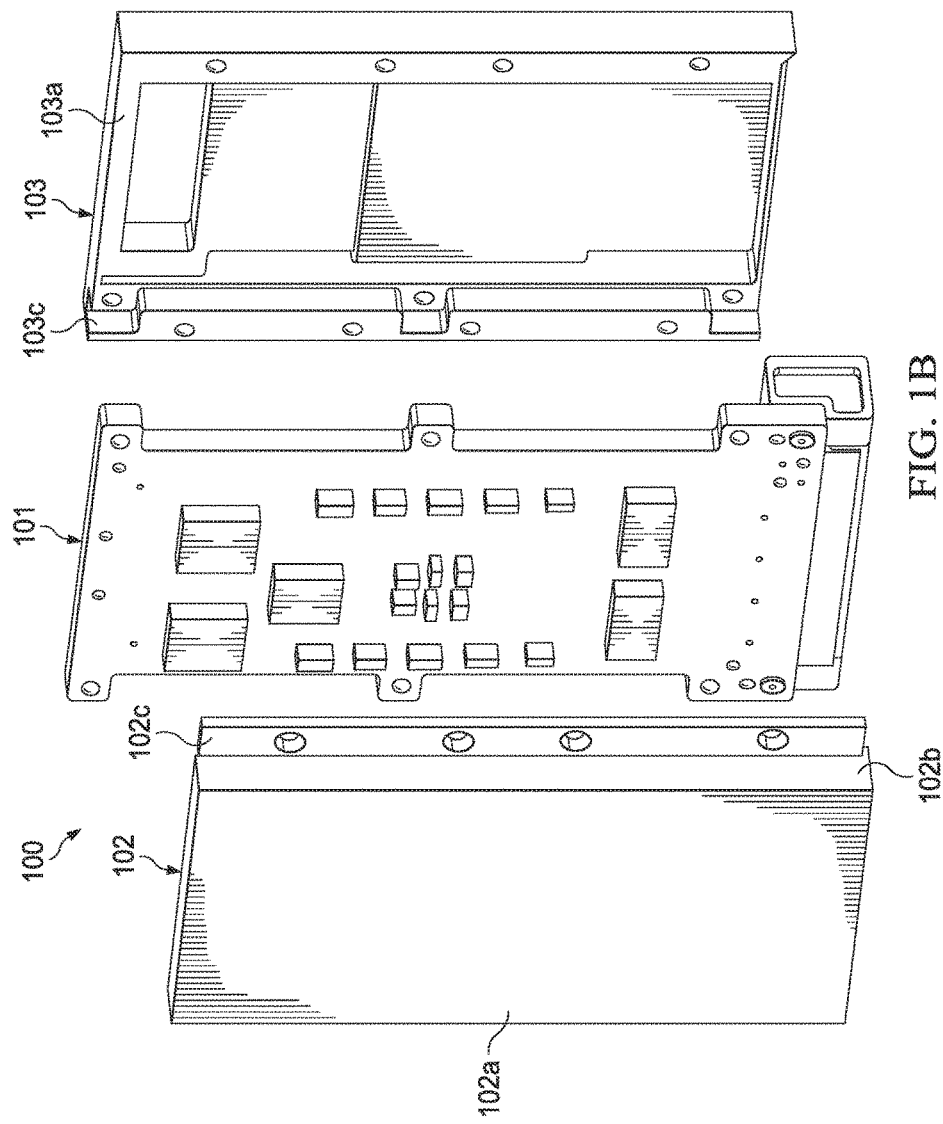

FIGS. 1A and 1B are different perspective views of an electronics card module implementing multi-level oscillating heat pipes in accordance with embodiments of the present disclosure. The electronic circuit card module 100 includes at least one (and optionally more than one) printed wiring board 101 on which various electronic components are mounted. Those electronic components are typically the source of heat that must be diffused or spread, and ultimately dissipated, in order to maintain either physical or functional integrity of the electronic card circuit module. When mounted for use, each printed wiring board 101 is held between a base (or "bounding") cover 102 and, preferably, one or more heats sink 103 (although a multi-card electronic circuit card module may have multiple bounding covers and no more than one or two heat sinks). In the present disclosure, multi-level oscillating heat pipe sections are included in both the core of the heat sink 103 and the base cover 102 of the electronic circuit card module 100.

In some embodiments, the heat sink 103 may be centrally located within a stack, having a printed wiring board 101 in contact with both surfaces of the heat sink 103 (e.g., a mezzanine electronic card and a main electronic card on opposite sides of the heat sink) and base covers 102 over opposite sides of the printed wiring boards 101 from the shared heat sink 103.

In the embodiments of interest in the present disclosure, one or both of the base cover 102 and the heat sink 103 has an open box shape. An internal portion of a body 102a, 103a for the respective structures contacts a device surface and/or a volume of space requiring heat dissipation. Sidewalls 102b, 103b project from peripheral edges of the body 102a, 103a and at least partially enclose a volume within which part or all of the printed wiring board 101 is received. Contact flanges 102c, 103c extend from the ends of the sidewalls 102b, 103b furthest from the body 102a, 103a and provide structure for securing the base cover 102 or the heat sink 103 to another structure. While the sidewalls 102b, 103b are illustrated as generally perpendicular to the bodies 102a, 103a and the contact flanges 102c, 103c in the examples of FIGS. 1A and 1B, and the contact flanges 102c, 103c are shown as generally parallel to the bodies 102a, 103a, such relationships between the portions of the exemplary base cover 102 and heat sink 103 are not structural requirements of the present disclosure. Angled (e.g., sloped or battered) sidewalls and angled (splayed or narrowed) contact flanges may also be employed. In the present disclosure, the structures of interest include (a) an offset between the contact flanges and the body (hence "multi-level"), and (b) sidewalls extending between the periphery of the body and the contact flanges and forming, together with the body, a partially enclosed volume. As described in further detail below, the multi-level oscillating heat pipes of the present disclosure extend within the body, sidewalls, and contact flanges.

Figure 2:
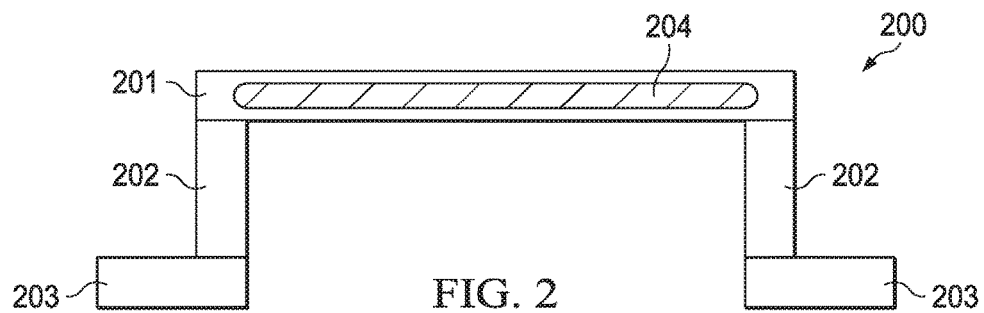
FIG. 2 is a simplified sectional view of a single planar oscillating heat pipe implementation in an electronic circuit card module cover having sidewalls and rail contact flanges at edges of the module.
Figure 3A:
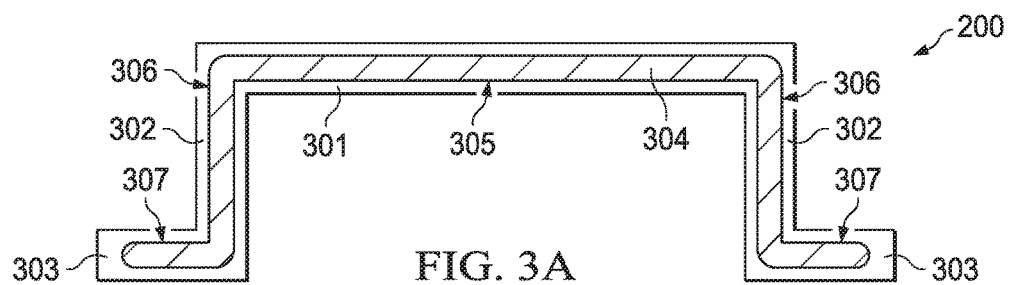
FIG. 3A is a simplified sectional view of a multi-level oscillating heat pipe implementation in an electronic circuit card module cover having sidewalls and rail contact flanges at edges of the module in accordance with an embodiment of the present disclosure.
Figure 3B:
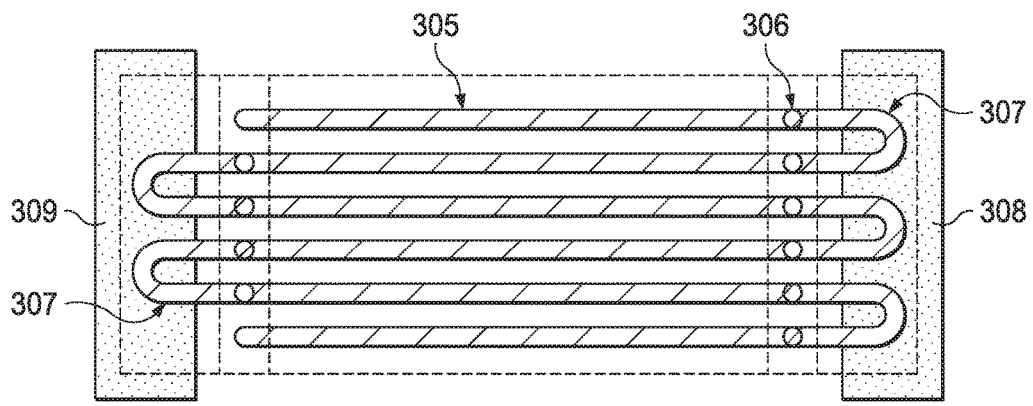
FIG. 3B is a plan view of the multi-level oscillating heat pipe implementation of FIG. 3A, with the structure other than the flow channels shown in phantom.
Figure 3C:
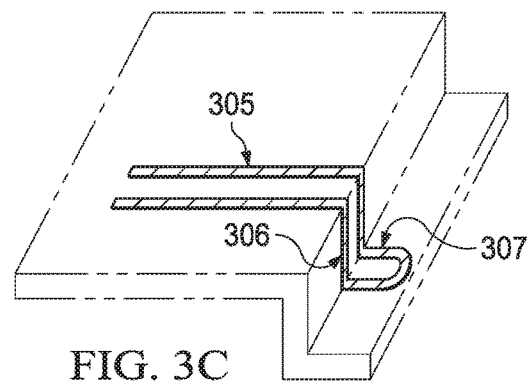
FIG. 3C is a perspective view of a portion of the multi-level oscillating heat pipe implementation of FIGS. 3A and 3B, again with the structure other than the flow channels shown in phantom.

FIG. 2 and FIGS. 3A through 3C may be considered in conjunction with each other for comparative purposes. FIG. 2 is a simplified sectional view of a single planar oscillating heat pipe implementation in an electronic circuit card module cover having sidewalls and contact flanges at edges of the module. FIG. 3A is a simplified sectional view of a multi-level oscillating heat pipe implementation in an electronic circuit card module cover having sidewalls and rail contact flanges at edges of the module in accordance with an embodiment of the present disclosure. FIG. 3B is a plan view of the multi-level oscillating heat pipe implementation of FIG. 3A, with the structure other than the flow channels shown in phantom. FIG. 3C is a perspective view of a portion of the multi-level oscillating heat pipe implementation of FIGS. 3A and 3B, again with the structure other than the flow channels shown in phantom. In these simplified illustrations of the general base cover and heat sink structures depicted in FIGS. 1A and 1B, the structures of interest include a body, sidewalls, and contact flanges. The electronic card module cover 200 in FIG. 2 includes a body 201 that contacts devices and/or volumes requiring heat dissipation. At the edges of the body 201 are projecting sidewalls 202 extending (in the example depicted) perpendicularly from the body 201. At the ends of sidewalls 202 are contact flanges 203 outwardly extending away from the region of the body 201 in a direction (within the example depicted) perpendicular to the sidewalls 202 and parallel with the body 201. The contact flanges 203 enable the electronic card module cover 200 to be secured to another structure, which in the present disclosure is presumed to be a coldwall interface to a region into which excess heat may be dissipated.

In the example of FIG. 2, oscillating heat pipes 204 are (neglecting cross-section) essentially two-dimensional or "planar," disposed only within the thin rectangular volume defined by the body 201. As a result, the thermal conductivity of the electronic card module cover 200 is limited at the edges to the thermal conductivity of the material from which sidewalls 202 and contact flanges 203 are formed. The improved thermal transfer benefit from providing the oscillating heat pipes 204 is thus limited to the region of the body 201. The thermal resistance between the edge of the body 201 and the coldwall against which the contact flanges 203 abut is therefore higher than the thermal resistance within the body 201, and may be the highest value within the series path of thermal conduction from a center of the body 201 to the coldwall.

The electronic card module cover 300 in FIGS. 3A through 3C has the same general structure as the electronic card module cover 200 in FIG. 2, including a body 201 with perpendicularly projecting sidewalls 302 at the edges and contact flanges 303 outwardly extending perpendicularly from ends of the sidewalls 302. Within the electronic card module cover 300, however, the oscillating heat pipes 304 are three-dimensional, extending within the volume of each of the body 301, the sidewalls 302, and the contact flanges 303. The two-dimensional oscillating heat pipe fluid channel path is extended into a three-dimensional system, taking fluid flow from a planar cover or heatsink core through corners into perpendicular structures and all the way to the clamped module edge. For simplicity and clarity, only a portion of the complete fluid path for oscillating heat pipes 304 is illustrated in FIGS. 3B and 3C. As shown in FIGS. 3A through 3C, the oscillating heat pipes 304 include horizontal segments 305 within the body 301 of the electronic card module cover 300, vertical segments 306 within the sidewalls 302 of the electronic card module cover 300, and horizontal segments 307 within the contact flanges 303 of the electronic card module cover 300.

Overall, the fluid path for oscillating heat pipes 304 is "serpentine," extending continuously across the width of the body 301, through the length of a first of the sidewalls 302, and into a first of the contact flanges 303, then turning 180° in a U shape within the first contact flange 303 to reverse direction back through the first contact flange 303 to one the sidewalls 302, through the length of the first sidewall and across the width of the body 301 to the opposite one of the sidewalls 302. The serpentine fluid path for oscillating heat pipes 304 then continues in like manner through the second of the sidewalls 302 and the second of the contact flanges 303, traversing alternately back and forth in opposite directions across the electronic card module cover 300. In the example of FIGS. 3A through 3C, the fluid path for oscillating heat pipes 304 traverses multiple 90° turns, from the U-shaped ends of the segments 307 within the contact flanges 303 to the segments 306 within the sidewalls 302, and from the segments 306 within the sidewalls 302 to the segments 305 within the body 301. The alternating tracks of the serpentine fluid path for oscillating heat pipes 304 cumulatively extend along substantially all of the length of the electronic card module cover 300. An evaporator 308 and a condenser 309 (not shown in FIG. 3A) may be formed below (or over, or enveloping) the U-shaped ends of the segments 307 in the contact flanges 303.

Because the contact flanges 303 are offset relative to the volume of the body 301, the fluid path for oscillating heat pipes 304 necessarily extends beyond the extended planes containing the body 301. In the example shown, a cross-sectional area of the segments 306 is oriented (approximately) perpendicularly to the cross-sectional area of the segments 305 and extends outside the volume bounding the segments 305. (The sidewalls 302 and the segments 306 therein may actually project outward from the body 301 in a battered fashion, at a slight angle to the perpendicular with the extended planes containing the body 301, in order to create more material at the edge and to minimize the possibility of leaks at the edge). Likewise, in the example shown, a cross-sectional area of the segments 307 is oriented perpendicularly to the cross-sectional area of the segments 306 and extends outside the volume bounding the segments 306, and in some regions is parallel with the cross-sectional area of the segments 305. This multi-level configuration of the oscillating heat pipes significantly reduces total thermal resistance to the clamped edge of contact flanges 307. Extending the three-dimensional flow path to the condenser section 309 allows the condenser section to be placed in direct contact with the chassis ribs and coldwall of a support structure.

Figure 4A:
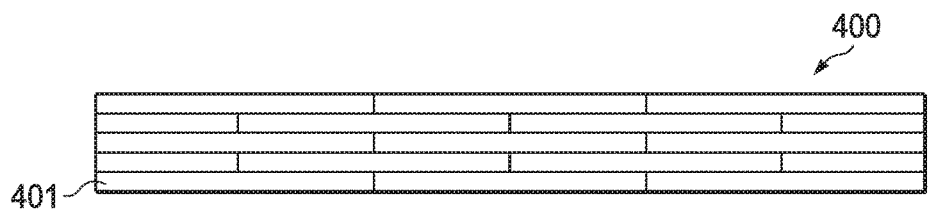
FIGS. 4A through 4C are a series of diagrams illustrating a process for forming a multi-level oscillating heat pipe implementation in an electronic circuit card module cover having sidewalls and contact flanges at edges of the module in accordance with an embodiment of the present disclosure.
Figure 4B:
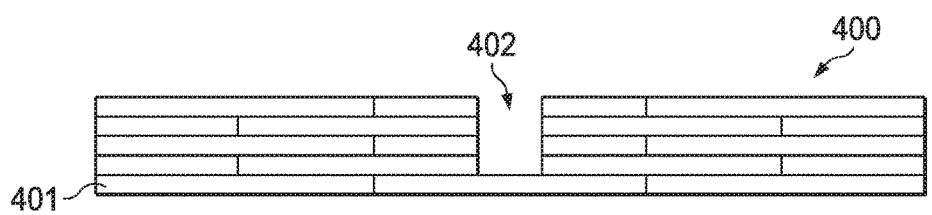
Figure 4C:
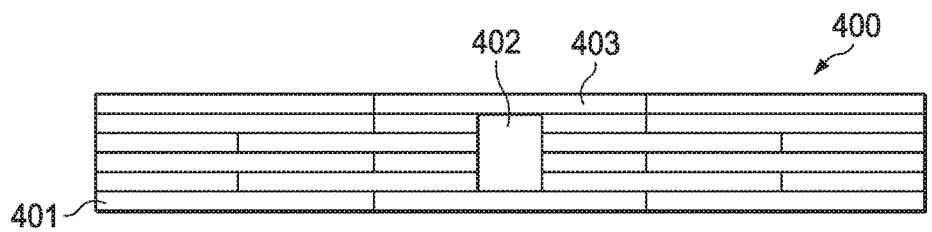

FIGS. 4A through 4C are a series of diagrams illustrating a process for forming a multi-level oscillating heat pipe implementation in an electronic circuit card module cover having sidewalls and rail contact flanges at edges of the module in accordance with an embodiment of the present disclosure. A section 400 of any of the body 301, sidewalls 302 and contact flanges 303 may be formed in the manner illustrated by FIGS. 4A through 4C, and the oscillating heat pipes 304 in each of those structures is formed in the same manner. Lengths of metal tape or foil 401, approximately 6 mils thick (for example), are ultrasonically welded together in staggered, overlapping layers as shown in FIG. 4A. The layers are added until a thickness accommodating the cross-sectional area of the oscillating heat pipes is reached. An opening 402 in the form of a channel for an oscillating heat pipe segment 305, 306 or 307 is then milled or otherwise formed in the aggregated layers by removal of portions of the metal tape lengths 401, as shown in FIG. 4B. The opening 402 may be, for example, 20 to 40 mils in width and height. Additional metal tape lengths 403 are disposed above the aggregate layers and over the opening 402 and ultrasonically welded in place to enclose the channel forming an oscillating heat pipe segment 305, 306 or 307, as shown in FIG. 4C.

The ultrasonic additive manufacturing technique described in connection with FIGS. 4A through 4C has been found to avoid issues that arise with alternative manufacturing techniques, such as the blocking or clogging of vertical heat pipe segments during formation by brazing metal forms. For example, in brazing outer metal forms around a central, patterned (e.g., etched) serpentine channel plate, the fluid path in vertical sections has a tendency to become blocked. In alternate embodiments, however, diffusion bonding or vacuum brazing may be employed to form the structure described above.

Figure 5A:
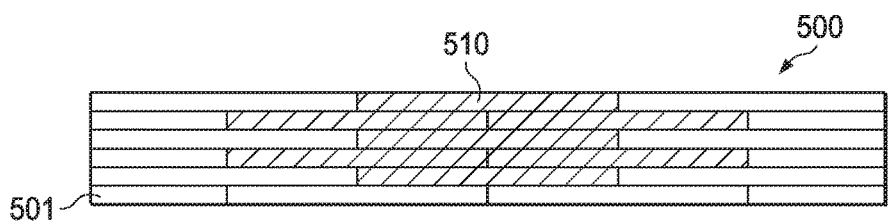
FIGS. 5A through 5C are a series of diagrams illustrating an alternative process for forming a multi-level oscillating heat pipe implementation in an electronic circuit card module cover having sidewalls and contact flanges at edges of the module in accordance with an embodiment of the present disclosure.
Figure 5B:
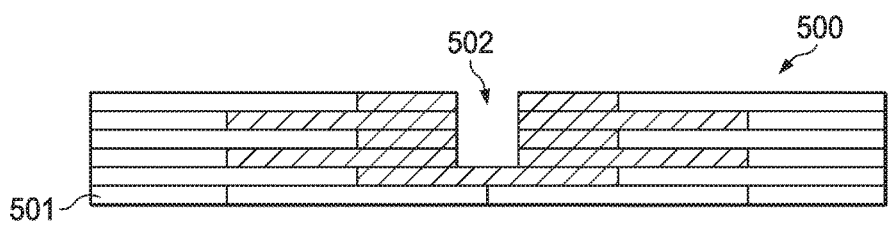
Figure 5C:
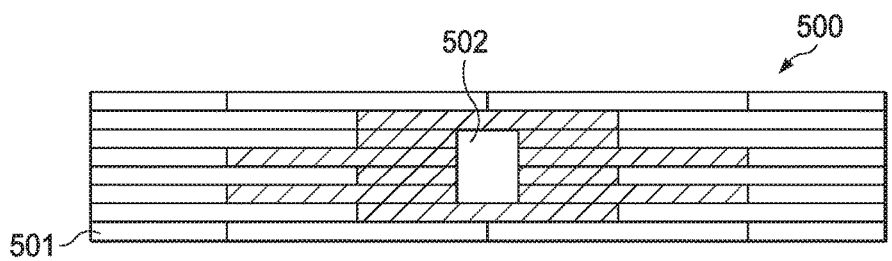

FIGS. 5A through 5C are a series of diagrams illustrating an alternative process for forming a multi-level oscillating heat pipe implementation in an electronic circuit card module cover having sidewalls and contact flanges at edges of the module in accordance with an embodiment of the present disclosure. The same processes and characteristics described above in connection with FIGS. 4A through 4C are applicable, with the exception of differences explicitly noted. A section 500 of any of the body 301, sidewalls 302 and contact flanges 303 formed in the manner illustrated by FIGS. 5A through 5C begins with ultrasonically welding lengths of metal tape 501 and 510 together in staggered, overlapping layers as shown in FIG. 5A. Metal tape 510 of a different material than metal tape 501 is used in the region where the channel for the oscillating heat pipe segment 305, 306 or 307 is to be formed. An opening 502 in the form of a channel for an oscillating heat pipe segment 305, 306 or 307 is milled in some of the aggregated layers of metal tape 510, as shown in FIG. 5B. Additional metal tape lengths are disposed above the aggregate layers and over the opening 502 and ultrasonically welded in place to enclose the channel forming an oscillating heat pipe segment 305, 306 or 307, as shown in FIG. 5C. The channel forming an oscillating heat pipe segment 305, 306 or 307 is effectively lined with the material of metal tape 510, which may have different properties better suited to movement of the fluid slugs/vapor bubbles therein. The remainder of the section 500 is formed of the material of metal tape 501, which may be less expensive, or may have better thermal conductivity.

The present disclosure enables implementation of an oscillating heat pipe into multiple levels of the heatsink core and one or both module covers of a circuit card module. The planar (horizontal) fluid channels of oscillating heat pipe serpentine flow path are vertically and laterally (in offset structures) extended to the clamped edges of the module, allowing movement of the condenser into direct contact at the clamped edges.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

The description in the present application should not be read as implying that any particular element, step, or function is an essential or critical element which must be included in the claim scope: the scope of patented subject matter is defined only by the allowed claims. Moreover, none of these claims are intended to invoke 35 USC §112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. §112(f).

What is claimed is:

1. A multi-level cooling structure, comprising:
   a body;
   sidewalls extending from edges of the body, wherein the sidewalls, together with the body, partially enclose a volume;
   flanges projecting from ends of the sidewalls opposite the body, wherein the flanges project away from the volume; and
   an oscillating heat pipe within the body, the sidewalls, and the flanges;
   wherein a fluid path for the oscillating heat pipe repeatedly traverses the body, a length of each of the sidewalls, and a portion of each of the flanges; and
   wherein the oscillating heat pipe is configured to provide cooling through both phase change of fluid slugs and vapor bubbles within the oscillating heat pipe and movement of the fluid slugs and the vapor bubbles along the fluid path between an evaporator adjacent a first of the flanges and a condenser adjacent a second of the flanges.

2. The multi-level cooling structure according to claim 1, wherein the oscillating heat pipe fluid path;

traverses the body and a first of the sidewalls and extends into the first flange,
turns in a U shape within the first flange back to the first sidewall,
traverses the first sidewall, the body, and a second of the sidewalls and extends into the second flange,
turns in a U shape within the second flange back to the second sidewall, and
traverses the second sidewall, the body, and the first sidewall.

3. The multi-level cooling structure according to claim 1, wherein the oscillating heat pipe fluid path turns 90° from the body into each of the sidewalls and from one of the sidewalls into one of the flanges.

4. The multi-level cooling structure according to claim 1, wherein a portion of the oscillating heat pipe fluid path within at least one of the flanges is offset from a portion of the oscillating heat pipe fluid path within the body.

5. The multi-level cooling structure according to claim 1, wherein segments of the oscillating heat pipe within the body are horizontal, segments of the oscillating heat pipe within the sidewalls are vertical, and segments of the oscillating heat pipe within the flanges are horizontal.

6. The multi-level cooling structure according to claim 1, wherein the oscillating heat pipe fluid path traverses the body in parallel tracks along a length of the body.

7. A circuit card module including the multi-level cooling structure according to claim 1, wherein the multi-level cooling structure comprises a module cover, the circuit card module further comprising:
a circuit card assembly at least partially received within the volume, one or more components on the circuit card assembly contacting the body of the multi-level cooling structure; and
a heat sink adjacent the circuit card assembly opposite the module cover.

8. A method, comprising:
within a multi-level structure formed by (i) a body, (ii) sidewalls extending from edges of the body and, together with the body, partially enclosing a volume, and (iii) flanges projecting from ends of the sidewalls opposite the body and away from the volume, providing an oscillating heat pipe within the body, the sidewalls, and the flanges, wherein a fluid path for the oscillating heat pipe repeatedly traverses the body, a length of each of the sidewalls, and a portion of each of the flanges; and
providing an evaporator adjacent a first of the flanges and a condenser adjacent a second of the flanges, wherein the oscillating heat pipe is configured to provide cooling through both phase change of fluid slugs and vapor bubbles within the oscillating heat pipe and movement of the fluid slugs and the vapor bubbles along the fluid path between the evaporator and the condenser.

9. The method according to claim 8, wherein the oscillating heat pipe fluid path;
traverses the body and a first of the sidewalls and extends into the first flange,
turns in a U shape within the first flange back to the first sidewall,
traverses the first sidewall, the body, and a second of the sidewalls and extends into the second flange,
turns in a U shape within the second flange back to the second sidewall, and
traverses the second sidewall, the body, and the first sidewall.

10. The method according to claim 8, wherein the oscillating heat pipe fluid path turns 90° from the body into each of the sidewalls and from one of the sidewalls into one of the flanges.

11. The method according to claim 8, wherein a portion of the oscillating heat pipe fluid path within at least one of the flanges is offset from a portion of the oscillating heat pipe fluid path within the body.

12. The method according to claim 8, wherein segments of the oscillating heat pipe within the body are horizontal, segments of the oscillating heat pipe within the sidewalls are vertical, and segments of the oscillating heat pipe within the flanges are horizontal.

13. The method according to claim 8, wherein the oscillating heat pipe fluid path traverses the body in parallel tracks along a length of the body.

14. The method according to claim 8, wherein the body, the sidewalls, and the flanges form a module cover, the method further comprising:
disposing a circuit card assembly at least partially within the volume with one or more components on the circuit card assembly contacting the body; and
disposing a heat sink adjacent the circuit card assembly opposite the module cover.

15. The method according to claim 8, further comprising:
forming the body, the sidewalls and the flanges using additive ultrasonic welding.

16. A circuit card module, comprising:
a module cover including a body and sidewalls partially enclosing a first volume, and flanges;
a heat sink including a body and sidewalls partially enclosing a second volume adjacent the first volume, and flanges;
a circuit card assembly within the first and second volumes with at least one component on the circuit card assembly in contact with one of the module cover body and the heat sink body;
an evaporator adjacent a first of the module cover flanges and a first of the heat sink flanges;
a condenser adjacent a second of the module cover flanges and a second of the heat sink flanges;
a first oscillating heat pipe within the module cover body, the module cover sidewalls, and the module cover flanges, wherein a first fluid path for the first oscillating heat pipe repeatedly traverses the module cover body, a length of each of the module cover sidewalls, and a portion of each of the module cover flanges; and
a second oscillating heat pipe within the heat sink body, the heat sink sidewalls, and the heat sink flanges, wherein a second fluid path for the second oscillating heat pipe repeatedly traverses the heat sink body, a length of each of the heat sink sidewalls, and a portion of each of the heat sink flanges,
wherein the first and second oscillating heat pipes are configured to provide cooling through both phase change of fluid slugs and vapor bubbles within the respective oscillating heat pipes and movement of the fluid slugs and the vapor bubbles along the first and second fluid paths between the evaporator and the condenser.

17. The circuit card module according to claim 16, wherein the second oscillating heat pipe fluid path:
traverses the heat sink body and a first of the heat sink sidewalls and extends into the first heat sink flange,
turns in a U shape within the first heat sink flange back to the first heat sink sidewall, traverses the first heat sink sidewall, the heat sink body, and a second of the heat sink sidewalls and extends into the second heat sink flange, turns in a U shape within the second heat sink flange back to the second heat sink sidewall, and traverses the second heat sink sidewall, the heat sink body, and the first heat sink sidewall.

18. The circuit card module according to claim 16, wherein the second oscillating heat pipe fluid path turns 90° from the heat sink body into each of the heat sink sidewalls and from one of the heat sink sidewalls into one of the heat sink flanges.

19. The circuit card module according to claim 16, wherein a portion of the second oscillating heat pipe fluid path within at least one of the heat sink flanges is offset from a portion of the second oscillating heat pipe fluid path within the heat sink body.

20. The circuit card module according to claim 16, wherein segments of the second oscillating heat pipe within the heat sink body are horizontal, segments of the second oscillating heat pipe within the heat sink sidewalls are vertical, and segments of the second oscillating heat pipe within the heat sink flanges are horizontal.

* * * * *